(12) United States Patent
Park et al.

(10) Patent No.: US 7,880,291 B2
(45) Date of Patent: Feb. 1, 2011

(54) INTEGRATED CIRCUIT PACKAGE AND INTEGRATED CIRCUIT MODULE

(75) Inventors: Sang-Wook Park, Seongnam-si (KR); Joong-Hyun Baek, Suwon-si (KR); Hyung-Gil Baek, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 12/458,397

(22) Filed: Jul. 10, 2009

(65) Prior Publication Data

US 2009/0273905 A1 Nov. 5, 2009

Related U.S. Application Data

(62) Division of application No. 11/371,886, filed on Mar. 10, 2006, now abandoned.

(30) Foreign Application Priority Data

Jun. 16, 2005 (KR) ...................... 10-2005-0052009

(51) Int. Cl.
*H01L 23/48* (2006.01)
*H01L 23/04* (2006.01)
(52) U.S. Cl. ........................ 257/697; 257/698; 257/774; 257/686; 257/E23.141
(58) Field of Classification Search ................. 257/697, 257/774, 686, 698, E23.141
See application file for complete search history.

(56) References Cited

U.S. PATENT DOCUMENTS

| | | | | |
|---|---|---|---|---|
| 5,036,431 A | | 7/1991 | Adachi et al. | 361/803 |
| 5,541,449 A | * | 7/1996 | Crane et al. | 257/697 |
| 5,701,233 A | * | 12/1997 | Carson et al. | 361/735 |
| 6,013,948 A | * | 1/2000 | Akram et al. | 257/698 |
| 6,229,207 B1 | | 5/2001 | Master | 257/697 |
| 6,351,392 B1 | | 2/2002 | Palaniappa | 361/785 |
| 6,429,453 B1 | | 8/2002 | Park | 257/48 |
| 6,476,476 B1 | * | 11/2002 | Glenn | 257/686 |
| 6,862,189 B2 | * | 3/2005 | Higuchi | 361/767 |
| 7,332,800 B2 | * | 2/2008 | Kikuchi et al. | 257/686 |
| 2001/0015491 A1 | * | 8/2001 | Shiraishi | 257/697 |

FOREIGN PATENT DOCUMENTS

| | | |
|---|---|---|
| JP | 2002-373916 | 12/2002 |
| JP | 09-246466 | 8/2006 |
| KR | 100196291 B1 | 2/1999 |
| KR | 1020000063759 A | 11/2000 |
| KR | 1020030066995 A | 8/2003 |

OTHER PUBLICATIONS

Korean Office Action with English translation dated Aug. 30, 2006.

* cited by examiner

*Primary Examiner*—Nitin Parekh
(74) *Attorney, Agent, or Firm*—Harness, Dickey & Pierce, P.L.C.

(57) ABSTRACT

An integrated circuit package may include a board that may support an integrated circuit chip. A post pin may be provided on a surface of the board. The post pin may be electrically connected to the integrated circuit chip. A land pin may be provided on the other surface of the board. The land pin may be electrically connected to the integrated circuit chip.

20 Claims, 8 Drawing Sheets

INTEGRATED CIRCUIT PACKAGE AND INTEGRATED CIRCUIT MODULE

PRIORITY STATEMENT

This application is a Divisional of U.S. application Ser. No. 11/371,886, filed Mar. 10, 2006 now abandoned which claims the benefit of Korean Patent Application No. 10-2005-0052009, filed on Jun. 16, 2005, in the Korean Intellectual Property Office, the disclosure each of which is incorporated herein in its entirety by reference.

BACKGROUND

1. Field of the Invention

Example embodiments of the present invention relate to an integrated circuit package and an integrated circuit module, and more particularly to an integrated circuit package and an integrated circuit module that may provide reliable electrical connections during a stacking process.

2. Description of the Related Art

An integrated circuit chip may have a significant number of data input/output pads. Accordingly, an integrated circuit package (that may implement the integrated circuit chip) may have a significant number of pins. A ball grid array (BGA) packaging technology may be pursued as a method of forming external connection terminals in an integrated circuit package. The BGA packaging technology may implement solder balls instead of pins for electrical connection with an external device.

Figure 1:
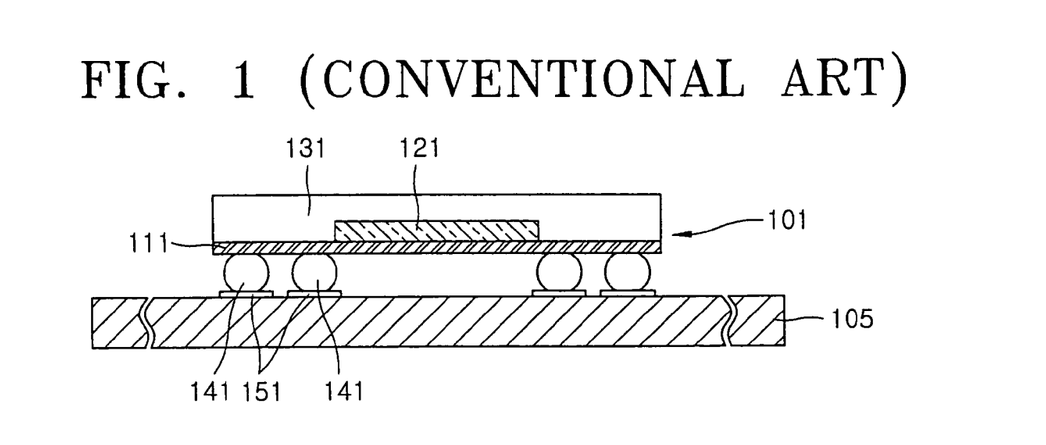
FIG. 1 is a cross-sectional view of a conventional BGA package stacked on a printed circuit board.

FIG. 1 is a cross-sectional view of a conventional BGA package that may be stacked on a printed circuit board.

Referring to FIG. 1, the BGA package 101 may include a board 111. An integrated circuit chip 121 may be mounted on the board 111. A molding resin 131 may seal the integrated circuit chip 121. Solder balls 141 may be provided on the board 111. The printed circuit board 105 may include a plurality of solder lands 151.

An infrared reflow process may be implemented to bond the solder balls 141 to corresponding solder lands 151 to electrically connect together the BGA package 101 and the printed circuit board 105.

Figure 2:
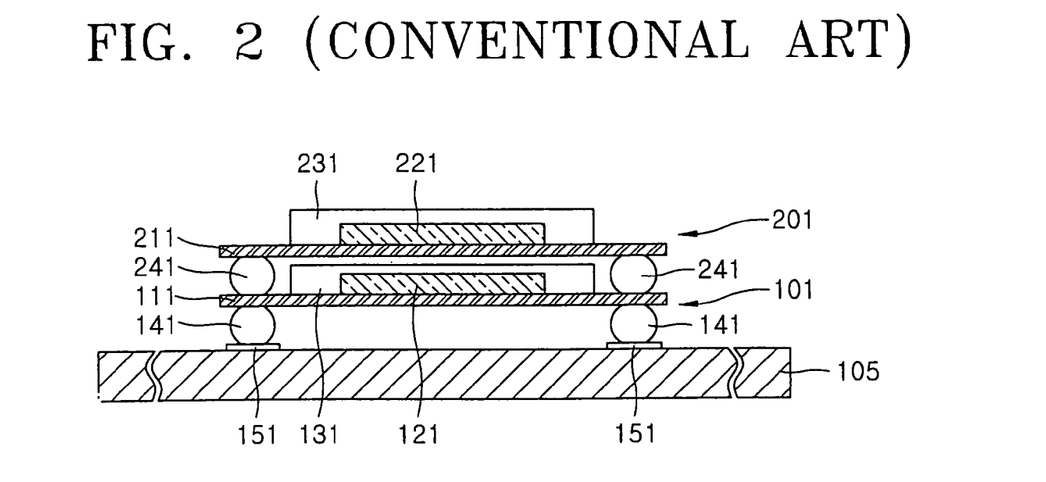
FIG. 2 is a cross-sectional view of another conventional BGA package stacked on the BGA package shown in FIG. 1.

FIG. 2 is a cross-sectional view of another BGA package that may be stacked on the BGA package shown in FIG. 1.

Referring to FIG. 2, the stacked BGA package 201 may include an integrated circuit chip 221 mounted on a board 211. The integrated circuit chip 221 may be molded with a molding resin 231. The BGA package 101 and the stacked BGA package 201 may be electrically connected together by solder balls 241. An infrared reflow process may be implemented to bond the solder balls 241 to desired package components.

Although the conventional packages are generally thought to be acceptable, they are not without shortcomings.

For example, a solder joint may be weakened by thermal mismatch between the solder balls 141 and the solder lands 151. Accordingly, the solder balls 141 may become disjoined from the solder lands 151.

Also, a solder joint may be weakened by warpage of the BGA packages 101 and 201. Accordingly, the solder balls 141 may become disjoined from the solder lands 151.

Furthermore, a solder material may creep from a solder joint area during a thermal cycle process because a melting point of a solder is low. Accordingly, the solder joint may become disjoined.

Moreover, a solder joint area may crack when the BGA packages and/or the printed circuit board receives external mechanic impact because a solder may be formed of a fragile intermetallic compound. Such a crack may cause disjoining of the solder joint.

Finally, a temperature environment may be higher than 230° C. when the BGA package 201 is stacked on the BGA package 101, and/or when the BGA package 101 is stacked on the printed circuit board 105. The integrated circuit chips 121, 221 may be damaged by such a temperature environment. The above noted shortcomings may become more prevalent as the number of infrared reflow processes increases.

SUMMARY

According to an example, non-limiting embodiment, a package may include a board that may support an integrated circuit chip. A post pin may be provided on a surface of the board. The post pin may be electrically connected to the integrated circuit chip. A land pin may be provided on another surface of the board. The land pin may be electrically connected to the integrated chip.

According to another example, non-limiting embodiment, a module may include a first package that may have a first board. A land pin may be provided on the first board. A first integrated circuit chip may be mounted on the first board. The land pin may project from the first board. The land pin may be electrically connected to the first integrated circuit chip. A second package may include a second board, a post pin, and a second integrated circuit chip may be mounted on the second board. The post pin may project from the second board. The post pin may be electrically connected to the second integrated circuit chip. The second package may be stacked on the first package, such that the post pin may be joined to the land pin.

According to another example, non-limiting embodiment, a module may include a stack of packages. Each package may include a board that may support an integrated circuit chip. A post pin may be provided on a first surface of the board. The post pin may be electrically connected to the integrated circuit chip. A land pin may be provided on a second surface of the board. The land pin may be electrically connected to the integrated circuit chip. The post pin of one package may be joined to the land pin of an adjacent package.

According to another example, non-limiting embodiment, a module may include a printed circuit board. The printed circuit board may include a circuit board having electric circuits. A land pin may be provided on a surface of the circuit board. The land pin may have a concavity. The land pin may be electrically connected to the electric circuits. An integrated circuit package may be stacked on the printed circuit board.

According to another example, non-limiting embodiment, a package may include a substrate. An integrated circuit chip may be provided on the substrate. A pair of conductive supports may be provided on opposite sides of the substrate. The pair of conductive supports may be electrically connected to the integrated circuit chip.

BRIEF DESCRIPTION OF THE DRAWINGS

Example, non-limiting embodiments of the present invention will be described with reference to the attached drawings in which.

The drawings are provided for illustrative purposes only and are not drawn to scale. The spatial relationships and relative sizing of the elements illustrated in the various embodiments may be reduced, expanded and/or rearranged to improve the clarity of the figure with respect to the corresponding description. The figures, therefore, should not be interpreted as accurately reflecting the relative sizing or positioning of the corresponding structural elements that could be encompassed by an actual device manufactured according to example embodiments of the invention.

DETAILED DESCRIPTION OF EXAMPLE, NON-LIMITING EMBODIMENTS

Example, non-limiting embodiments of the present invention will be described with reference to the accompanying drawings. This invention may, however, be embodied in many different forms and should not be construed as limited to example embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

Well-known structures and processes are not described or illustrated in detail to avoid obscuring the present invention.

An element is considered as being mounted (or provided) "on" another element when mounted or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

Figure 3:
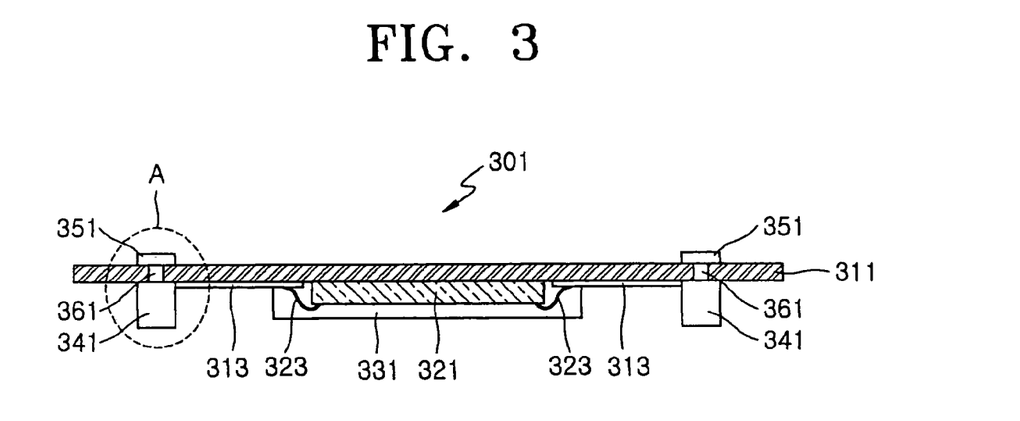
FIG. 3 is a cross-sectional view of an integrated circuit package according an example embodiment of the present invention.

FIG. 3 is a cross-sectional view of an integrated circuit package according to an example embodiment of the present invention.

Referring to FIG. 3, the integrated circuit package 301 may include a board 311, an integrated circuit chip 321, a molding resin 331, a plurality of first conductive supports 341 and a plurality of second conductive supports 351. In the example embodiments, the first conductive supports 341 may be referred to as "post pins" 341, and the second conductive supports 351 may be referred to as "land pins" 351. However, the first and the second conductive supports 341 and 351, respectively, are not limited to any particular shape, as will become more apparent by the description of the example, non-limiting embodiments that follows.

The integrate circuit chip 321 may be mounted on the board 311. The integrated circuit chip 321 may be electrically connected to conductive lines 313 by bonding wires 323, for example. The conductive lines 313 may be metal lines, for example. The integrated circuit chip 321 and the boding wires 323 may be sealed by the molding resin 331. The molding resin 331 may (for example) protect the integrated chip 321 and the bonding wires 323 from the external environment.

The metal lines 313 may extend along the surface of (or within) the board 311. The metal lines 313 may be electrically connected to the post pins 341. Accordingly, the post pins 341 may be electrically connected to the integrated circuit chip 321 through the metal lines 313 and the bonding wires 323.

The post pins 341 may project from the lower surface of the board 311. In this example embodiment, the post pins 341 may have an elongated shape. In alternative embodiments, the post pins 341 may have numerous and alternative shapes. By way of example only, four post pins 341 having a square cross-sectional shape may be provided. However, more or less than four post pins 341 may be suitably implemented, and the post pins 341 may have any geometric cross-section shape. In this example embodiment, the post pins 341 may have a uniform thickness. In alternative embodiments, the thickness of the post pin 341 may vary along the vertical length of the post pin 341. The post pins 341 may project further from the board 311 than the land pins 351. By way of example only, the post pins 341 may have heights from 50 to 200 μm, while the land pins 351 may have heights from 0 to 30 μm. In this example embodiment, the post pins 341 may be provided on the same side of the board 311 as the integrated circuit chip 321. In alternative embodiments, the post pins 341 and the integrated circuit chip 321 may be provided on opposite sides of the board 311. By way of example only, the post pins 341 may be fabricated from metal.

The land pins 351 may be arranged at locations on the board 311 that correspond to the locations of the post pins 341. The land pins 351 and the post pins 341 may be provided on opposite sides of the board 311. Land pins 351 of numerous and varied shapes may be suitably implemented. Via holes 361 may be provided between the land pins 351 and the post pins 341. The via holes 361 may be filled with a conductive material, such as metal, for example. The land pins 351 and the post pins 341 may be electrically connected together through the metal in the via holes 361. By way of example only, the land pins 351 may be fabricated from metal.

Figure 4:
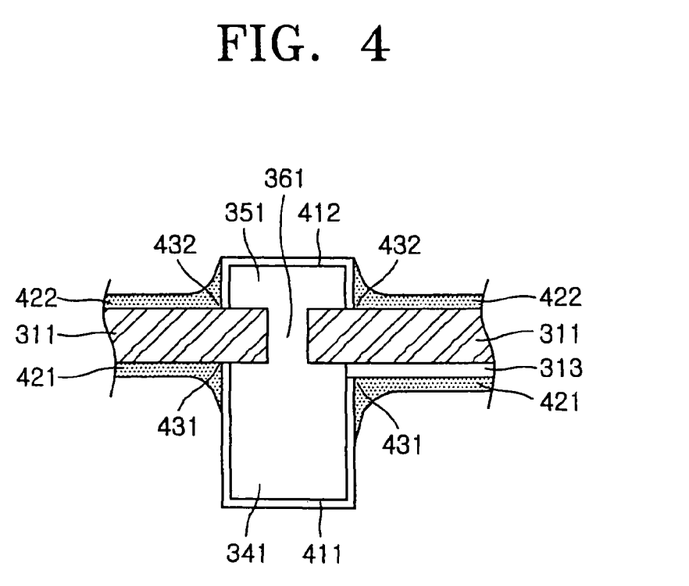
FIG. 4 is a cross-sectional view of a portion "A" shown in FIG. 3.

FIG. 4 is a cross-sectional view of the portion "A" shown in FIG. 3.

Referring to FIG. 4, the post pin 341 and the land pin 351 may be coated with conductive materials 411, 412. The conductive materials 411, 412 may include (for example) nickel, gold, and/or copper. Consider the following illustrative examples. The post pin 341 and the land pin 351 may be fabricated from copper and coated with a compound metal of gold and nickel. The post pin 341 and the land pin 351 may be fabricated from copper and coated with nickel and then coated with gold. Here, the thickness of the gold coating layer may be less than the thickness of the nickel coating layer. The post pin 341 and the land pin 351 may be fabricated from copper and coated with gold and then coated with copper. The post pin 341 and the land pin 351 may be fabricated from copper and coated with nickel and then coated with copper.

Corners 431, 432 of base portions of the post pin 341 and the land pin 351 may be coated with resin, such as photo solder resist (PSR), for example. The PSR 421, 422 may (for example) protect the corners 431, 432 from being broken and/or cracked.

Figure 5:
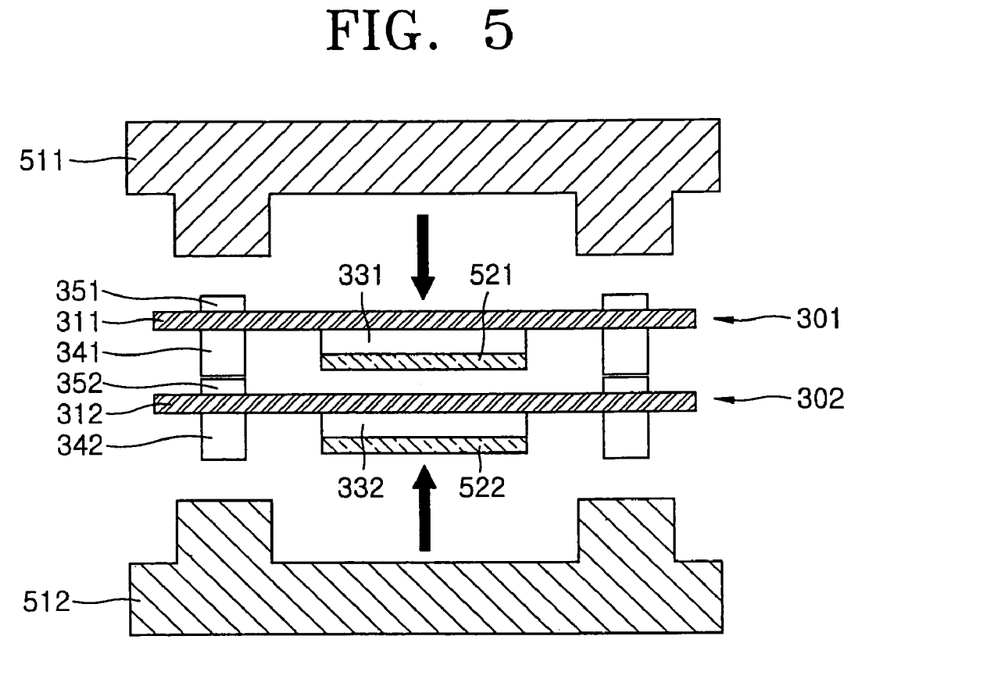
FIG. 5 is a cross-sectional view of a method that may be implemented for stacking two integrated circuit packages.

FIG. 5 is a cross-sectional view of a method that may be implemented for stacking two integrated circuit packages.

Referring to FIG. 5, a second integrated circuit package 302 may be arranged below a first integrated circuit package 301. Elements 311, 331, 341, 351 of the first integrated circuit package 301 have structures identical to elements 312, 332, 342, 352 the second integrated circuit package 302.

Blocks 511, 512 may be implemented to stack the first and the second integrated circuit package 301 and 302. The blocks 511, 512 may be heated to temperatures from 200 to 300° C. Once heated, the blocks 511, 512 may press the first and the second integrated circuit packages 301 and 302 together. The block 511 may confront the land pins 351 of the first integrated circuit package 301, and other block 512 may confront the post pins 342 of the second integrated circuit package 302. The heated blocks 511 and 512 may press the first and the second integrated circuit packages 301 and 302 to join together the post pins 341 of the first integrated circuit package 301 and the land pins 352 of the second integrated circuit package 302.

Because the heated blocks 511 and 512 may be implemented to stack the first and the second integrated circuit packages 301 and 302, a conventional reflow process (e.g., an infrared reflow process) may not be required. As described above, the infrared reflow process may be performed for the solder joint of the solder balls 141 and solder lands 151 of the BGA package as shown in FIG. 1 according to the conventional art.

As shown in FIG. 5, heat sinks 521, 522 may be mounted on the molding resins 331 and 332.

The heat sinks 521 and 522 may absorb heat applied while stacking the integrated circuit packages 301 and 302 using the heated blocks 511 and 522. In this way, the heat sinks 521 and 522 may protect the integrated circuit chip 321 of FIG. 3 from heat.

In the example embodiment, the heat sinks 521 and 522 may be mounted on the same side of the board as the molding resins 331 and 332. In alternative embodiments, the heat sinks and the molding resins may be mounted on opposite sides of the boards, respectively.

Figure 6:
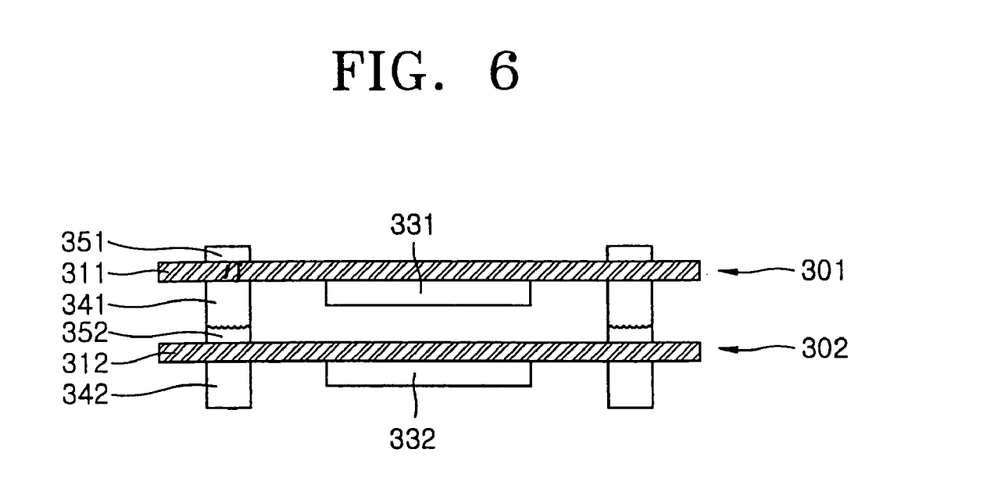
FIG. 6 is a cross-sectional view of an integrated circuit module including two stacked integrated circuit packages shown in FIG. 3.

FIG. 6 is a cross-sectional view of an integrated circuit module including a stacked of two integrated circuit packages. The two integrated circuit packages 301 and 302 may have the same structure as the integrated circuit package 301 shown in FIG. 3.

Referring to FIG. 6, the post pins 341 of the first integrated circuit package 301 may be joined to the land pins 352 of the second integrated circuit package 302.

In the example embodiment, the integrated circuit module includes two integrated circuit packages. In alternative embodiments, an integrated circuit module may include a stack of more than two integrated circuit packages.

After joining together the post pins 341 and the land pins 352, the joint areas may be coated with a ductile plating material and/or a bonding material. Therefore, the joint areas of the post pins 341 and the land pins 352 may be protected from external impacts, and the joint condition of the joint areas may be maintained.

As shown in FIGS. 3 through 6, the post pins 341, 342 and the land pins 351 and 352, which may be fabricated from metal, may be provided on the boards 311, 312. The post pins 341, 342 and the land pins 351, 352 may be joined together by mechanical force. In this way, the infrared reflow process may not be required. Furthermore, the electrical connection state between the post pins and the land pins may be maintained because the joint state of the post pins 341 and the land pins 351 may not be influenced by external temperature, thermal variation, warpage of the integrated circuit packages 301, 302 and/or external mechanical impact.

Figure 7:
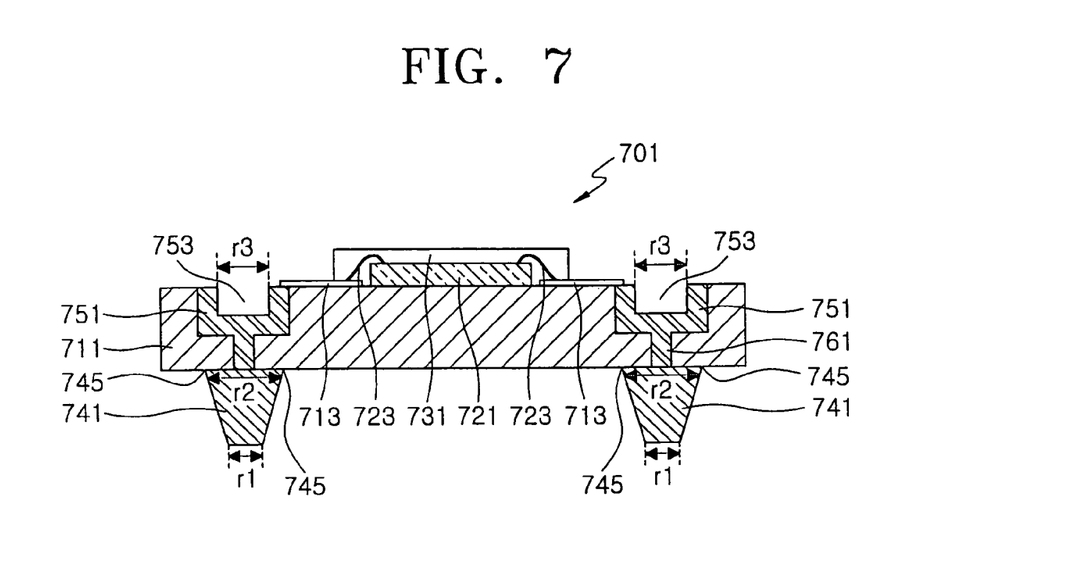
FIG. 7 is a cross-sectional view of an integrated circuit package according another example embodiment of the present invention.

FIG. 7 is a cross-sectional view of an integrated circuit package according another example embodiment of the present invention.

Referring to FIG. 7, the integrated circuit package 701 may include an integrated circuit chip 721, a molding resin 731, a plurality of post pins 741 and a plurality of land pins 751.

The board 711, metal lines 713, integrated circuit chip 721, bonding wires 723 and molding resin 731 may be structurally and functionally identical to the metal lines 313, the integrated circuit chip 321, the bonding wires 323 and the molding resin 331 shown in FIG. 3, and therefore a detailed description of the same is omitted.

The post pins 741 may project from a surface of the board 711. In this example embodiment, the post pins 741 may have an elongated shape and have a circular cross-sectional shape. The post pins 741 may be provided on any surfaces of the board. The post pins 741 may be fabricated from metal.

The land pins 751 may be provided with holes 753. By way of example only, the holes 753 may be provided at a center of the land pins 751. The land pins 751 may be arranged at locations on the board 711 that correspond to location of the post pins 741. The land pins 751 and the post pins 741 may be provided on opposite sides of the board 711. Via holes 761 may be provided between the land pins 751 and the post pins 741. The via holes 761 may be filled with a conductive material, such as metal, for example. The land pins 751 and the post pins 741 may be electrically connected together through the metal in the via holes 761. The land pins 751 may be fabricated from metal.

The post pins 741 and the land pins 751 may be coated with conductive material. For example, the post pins 741 and the land pins 751 may be fabricated from copper and coated with compound metal of gold and nickel. The post pins 741 and the land pins 751 may be fabricated from copper and coated with nickel and then coated with gold. The post pins 741 and the land pins 751 may be fabricated from copper and coated with gold and then coated with copper. The post pins 741 and the land pins 751 may be fabricated from copper and coated with nickel and then coated with copper.

Corners 745 of base portions of the post pins 741 and the land pins 751 may be coated with PSR. The PSR may, for example, serve to protect the corners 745 from being cracked and/or broken.

Each post pin 741 may have a bottom surface having a diameter r1 shorter than a diameter r2 of the base portion of the post pin 741. Each land pin 751 may have a hole 753 with a diameter r3 that may be longer than the diameter r1 of the bottom surface of the post pin 741 and shorter than the diameter r2 of the base portion of the post pin 741. Therefore, the post pins of a second integrated circuit package 702 of FIG. 8 may be inserted to the holes 753 of the land pins 751.

Figure 8:
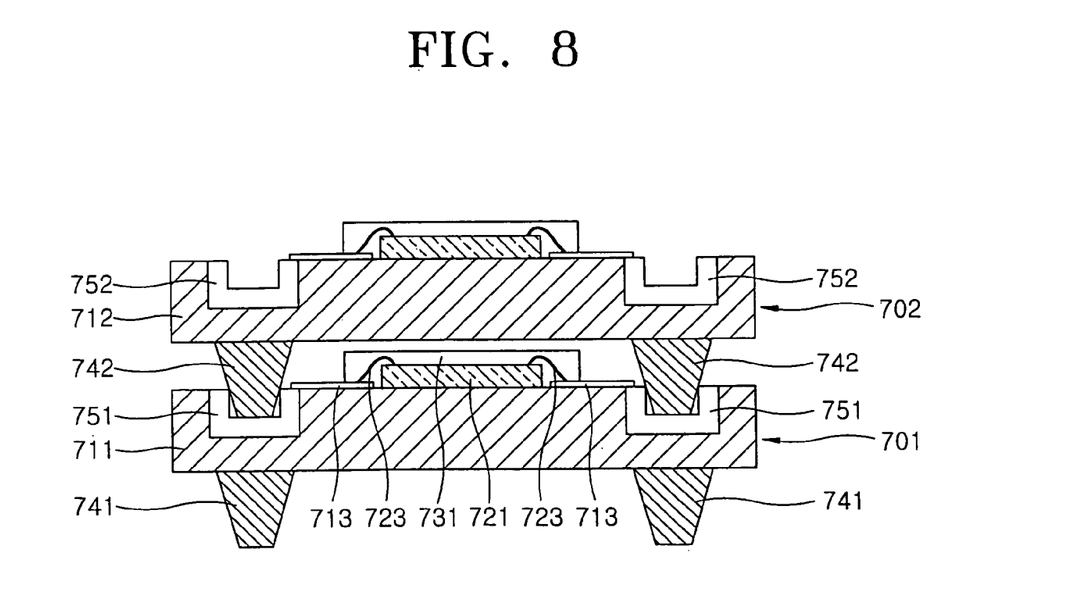
FIG. 8 is a cross-sectional view of an integrated circuit module configured with two stacked integrated circuit packages shown in FIG. 7.

FIG. 8 is a cross-sectional view of an integrated circuit module that may include two stacked integrated circuit packages shown in FIG. 7.

Referring to FIG. 8, the post pins 742 of the second integrated circuit package 702 may be joined to the land pins 751 of the first integrated circuit package 701. The post pins 742 and the land pins 752 of the second integrated circuit package 702 may be structurally identical to the post pins 741 and the land pins 751 of the first integrated circuit package 701.

In the example embodiment, the integrated circuit module may include two integrated circuit packages 701 and 702. In alternative embodiments, an integrated circuit module may be manufactured by stacking more than two integrated circuit packages 701 and 702.

The blocks 511 and 512 of FIG. 5 may be employed to stack the integrated circuit packages 701 and 702. The post pins 742 and the land pins 751 may be joined together by pressing the integrated circuit packages 701 and 702 using the blocks 511 and 512. Here, the blocks 511 and 512 may not be heated.

As described above, the blocks 511, 512 may be used to stack the integrated circuit packages 701 and 702. Therefore, the joining process of the present embodiment may not require a reflow process (e.g., the infrared reflow process that may be performed for the solder joint between the solder balls 141 and the solder lands 151 of the conventional BGA package as shown in FIG. 1). As a result, a cost associated with stacking the integrated circuit packages 701 and 702 may be reduced.

After joining the post pins 742 and the land pins 751a, the joint area may coated with a ductile plating material and/or a bonding material, for example. The coating may protect the joint area of the post pins 742 and the land pins 751a to maintain a desired joint state.

Figure 9A:
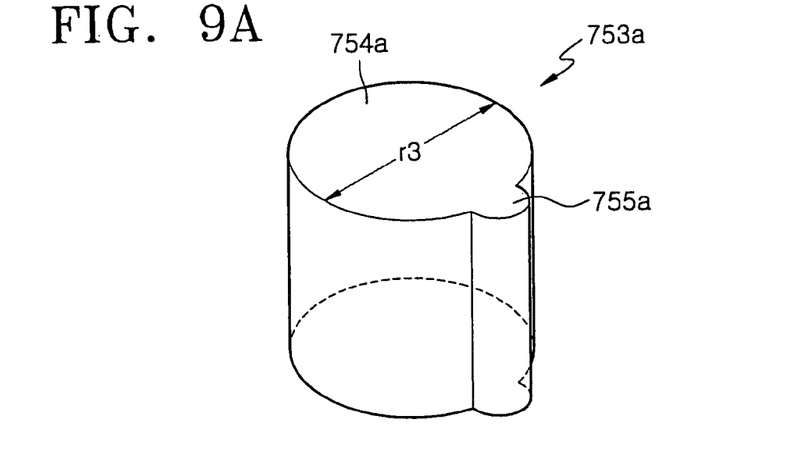
FIG. 9A is a perspective view of another example embodiment of the hole of the land pin shown in FIG. 7.
Figure 9B:
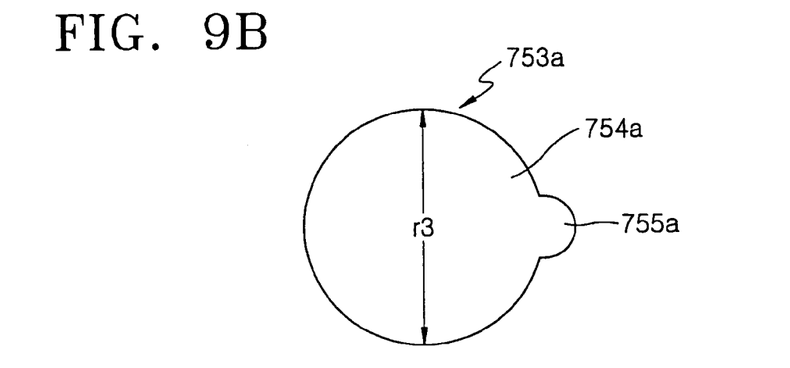
FIG. 9B is a plan view of the hole shown in FIG. 9A.

FIG. 9A is a perspective view of another example embodiment of the hole that may be provided in the land pin shown in FIG. 7, and FIG. 9B is a plan view of the hole shown in FIG. 9A.

Referring to FIGS. 9A and 9B, the hole 753a may include a main hole 754a having a relatively large diameter and a sub hole 755a having a diameter smaller than the main hole 754a.

When the second integrated circuit package 702 of FIG. 8 is stacked on the first integrated circuit package 701 of FIG. 8, the post pin 742 of the second integrated circuit package 702 may be inserted into the main hole 754a. Air pushed by the post pin 742 may be exhausted through the sub-hole 755a when the post pin 742 enters into the main hole 754a.

The sub hole 755a may protect the joint state from weakening, deteriorating and/or failure that may otherwise occur if air were to remain in the joint between the post pin 742 and the land pin.

Figure 10:
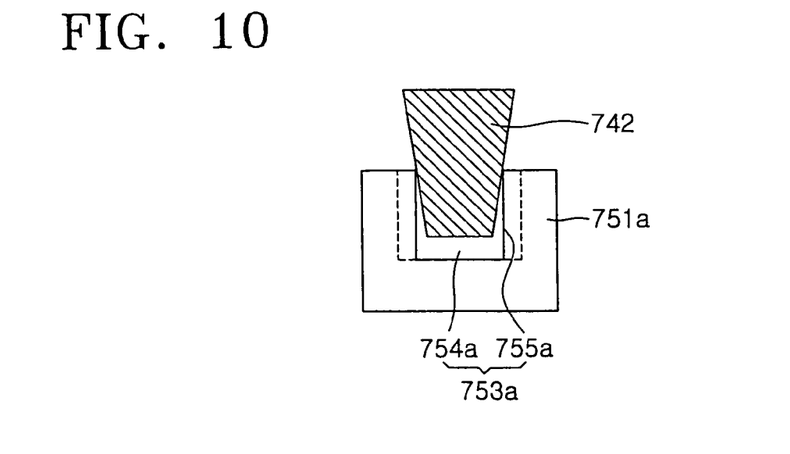
FIG. 10 is a cross-sectional view of the post pin of the stacked integrated circuit package shown in FIG. 8 provisionally joined to the land pin shown in FIG. 9.

FIG. 10 shows the post pin 742 of the stacked integrated circuit package 702 of FIG. 8 provisionally connected to the hole 753a of the land pin 751a.

Figure 11:
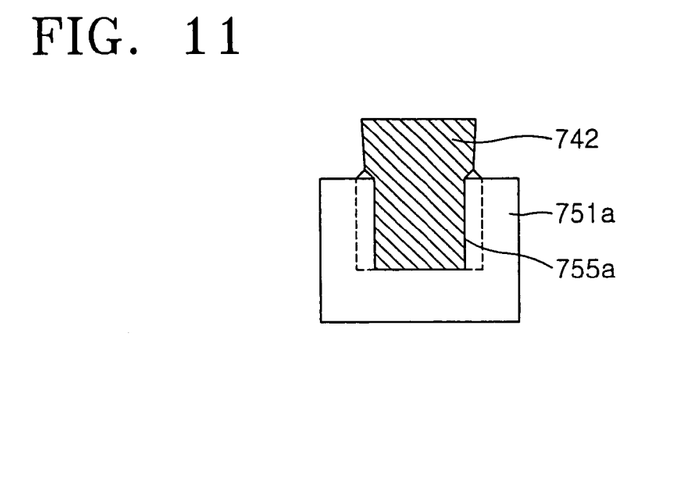
FIG. 11 is a cross-sectional view of the post pin completely joined to the land pin.

As shown in FIG. 10, electrical characteristics of the integrated circuit packages 701 and 702 of FIG. 8 may be measured upon provisionally joining the post pin 742 to the hole 754a of the land pin 751a. If the measured electric characteristics are not correct, then the post pin 742 may be disjoined from the land pin 751a and corrective action may be taken. If the measured electric characteristics are correct, the post pin 742 may be completely joined to the land pin 751a as shown in FIG. 11.

As described above, the electric characteristics of the integrated circuit packages may be analyzed before firmly joining the post pin 742 and the land pin 751a. Accordingly, a defective processing cost and/or a test cost may be reduced, for example.

Figure 12A:
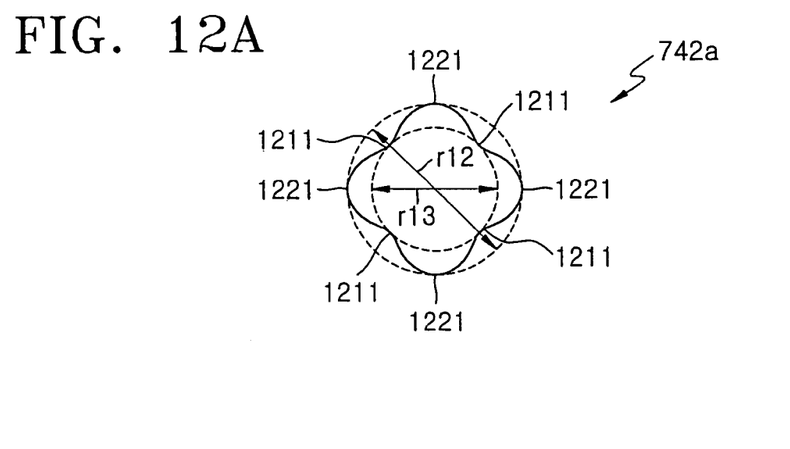
FIG. 12A is a plan view of another example embodiment of the post pin shown in FIG. 7.
Figure 12B:
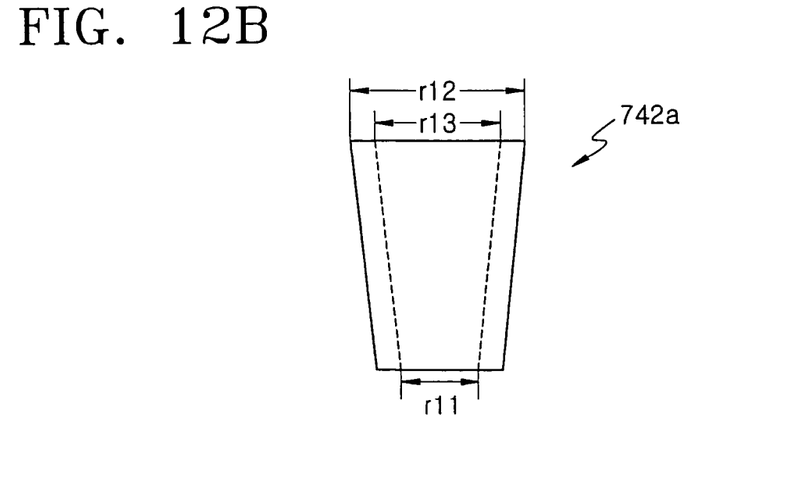
FIG. 12B is a side view of the post pin shown in FIG. 12A.

FIG. 12A shows another example embodiment of the post pin 742 of FIG. 8, and FIG. 12B is a side view of the post pin shown in FIG. 12A.

Referring to FIGS. 12A and 12B, the post pin 742a may include grooves on a side surface. For example, the post pin 742a may have an arcuate post shape having four furrows 1211 and four ridges 1221. A diameter r13 formed by the furrows 1211 may be shorter than a diameter r12 formed by the ridges 1221.

Also, the diameter r3 of the hole 753 of the land pin 751 of FIG. 7 may be longer than the diameter r11 of the bottom surface of the post pin 742a and shorter than the diameter r12 of the base portion of the post pin 742a. Accordingly, the post pin 742a may be easily inserted into a hole of the land pin 751

The furrows 1211 and the ridges 1221 may improve the bonding force between the post pin 742a and the land pin 751 of FIG. 8 because the ridges 1221 may be pushed into the furrows 1211 when the post pin 742a is joined to the land pin 751.

Figure 13:
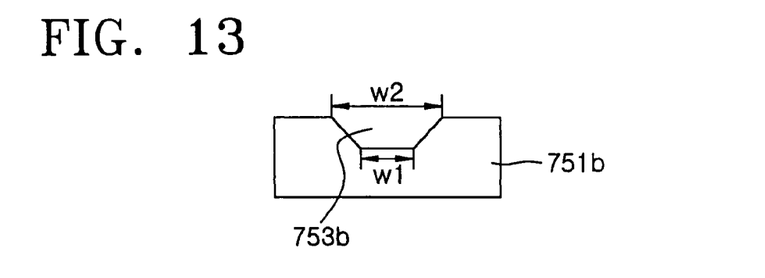
FIG. 13 is a cross-sectional view of another example embodiment of the land pin shown in FIG. 7.

FIG. 13 is a cross-sectional view of another example embodiment of the land pin 751b. Referring to FIG. 13, a hole 753b may be provided in the land pin 751. The hole 753b may have a bottom width w1 that may be narrower than the upper width w2. The bottom width w1 of the hole 753b may be about the same as or slightly wider than the diameter r1 of the bottom surface of the post pin 742. Accordingly, the post pin 742 of FIG. 8 may be easily inserted to the land pin 751b.

Figure 14:
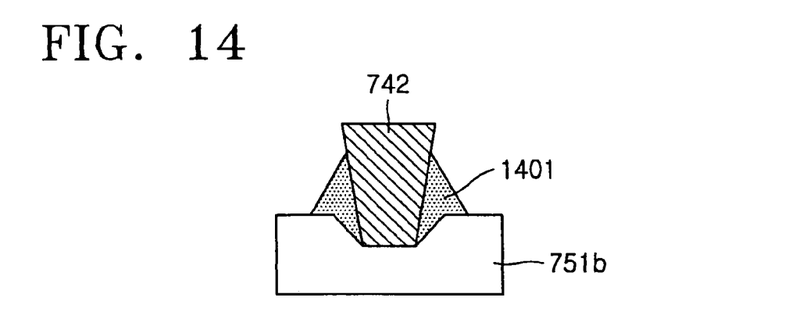
FIG. 14 is a cross-sectional view of the post pin of FIG. 8 joined to the land pin of FIG. 13.

FIG. 14 is a cross-sectional view of the post pin 742 of FIG. 8 joined to the land pin 751b of FIG. 13. Referring to FIG. 14, the post pin 742 may be inserted into the hole of the land pin 751b. Solder 1401 may be applied to the post pin 742 and the land pin 751b. The solder may improve the boding force of the post pin 742 and the land pin 751b.

Figure 15:
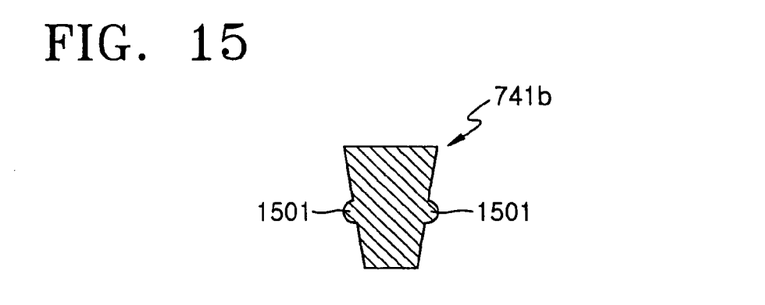
FIG. 15 is a cross-sectional view of another example embodiment of the post pin shown in FIG. 7.

FIG. 15 is a cross-sectional view of another example embodiment of the post pin 741b. Referring to FIG. 15, protrusions 1501 may be provided on a side surface of the post pin 741b.

Figure 16:
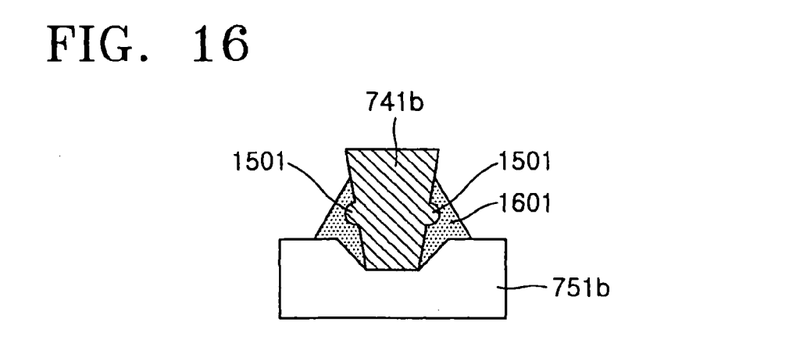
FIG. 16 is a cross-sectional view of the post pin of FIG. 15 joined to the land pin of FIG. 13.

FIG. 16 is a cross-sectional view of the post pin 741b of FIG. 15 joined to the land pin 751b of FIG. 13. Referring to FIG. 16, solder 1601 may be applied to the post pin 741b and the land pin 751b. The solder 1601 may enhance the bonding force between the post pin 741b and the land pin 751b.

Figure 17:
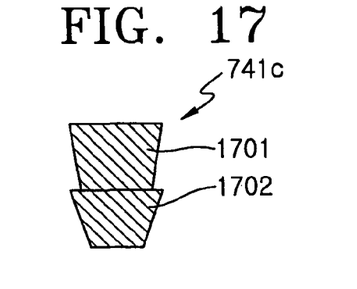
FIG. 17 is a cross-sectional view of another example embodiment of the post pin shown FIG. 7.

FIG. 17 is a cross-sectional view of another example embodiment of the post pin 741c. Referring to FIG. 17, the post pin 741c may have two stratums 1701 and 1702. In this example embodiment, each of the stratums 1701 and 1702 may have a circular post shape. The length of the post pin 741c may the same as the post pin 741 of FIG. 7.

Figure 18:
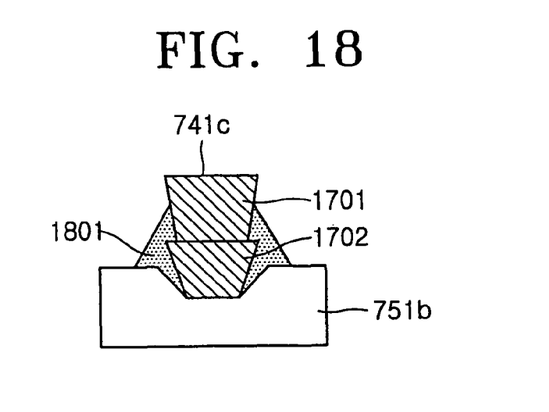
FIG. 18 is a cross-sectional view of the post pin of FIG. 17 joined to the land pin of FIG. 13.

FIG. 18 is a cross-sectional view of the post pin 741c of FIG. 17 joined to the land pin 751b of FIG. 13. Referring to FIG. 18, solder 1801 may be applied to the post pin 741c and the land pin 751b. The bonding force between the post pin 741c and the land pin 751b may be enhanced by forming the post pin 741c as plural stratums. Of course, more than two stratums may be suitably implemented.

Figure 19:
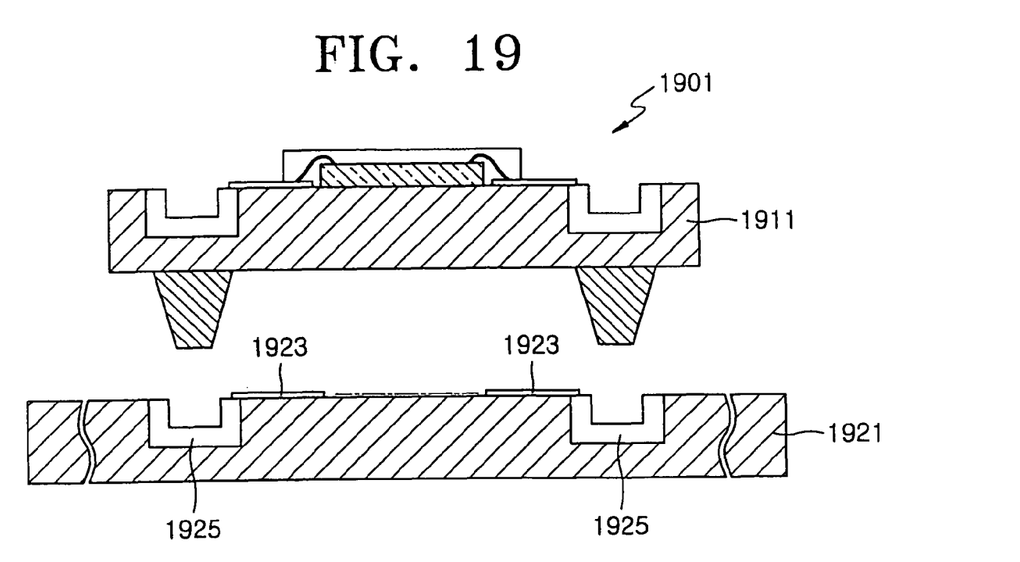
FIG. 19 is a cross-sectional view of an integrated circuit module according to an example embodiment of the present invention.

FIG. 19 is a cross-sectional view of an integrated circuit module according to an example embodiment of the present invention. Referring to FIG. 19, the integrated circuit module 1901 may include an integrated circuit package 1911 and a printed circuit board (PCB) 1921. The integrated circuit package 1911 may have a structure identical to the integrated circuit package 701 of FIG. 7. Therefore, the detailed description thereof is omitted.

The PCB 1921 may include circuit wires 1923 and land pins 1925. The land pins 1925 may be identical to the land pins 751 shown in FIG. 7.

As shown in FIG. 19, the integrated circuit module 1901 may be manufactured by providing the land pins 1925 on the PCB 1921 and stacking the integrated circuit package 1911 on the PCB 1921.

As described above, the post pins 341, 342, 741, 742 and the land pins 351, 352, 751, 752 may be metallically joined and/or mechanically joined together when the integrated circuit packages 301, 302, 701, 702, 1911 are stacked and/or when the integrated circuit packages 301, 302, 701, 702, 1911 are stacked on the PCB 1921.

The present invention has been shown and described with reference to example, non-limiting embodiments thereof. It will be understood by those of ordinary skill in the art that various changes in form and details may be made to the disclosed embodiments without departing from the spirit and scope of the present invention as defined by the following claims.

What is claimed is:

1. A module, comprising:
   a printed circuit board; and
   an integrated circuit package stacked on the printed circuit board;
   wherein the printed circuit board includes:
      electric circuits;
      at least one land pin provided on a first surface of the printed circuit board; and
      at least one post pin fixed on a second surface of the printed circuit board;
   wherein the at least one land pin is electrically connected to the electric circuits,
   wherein the at least one post pin is electrically connected to the electric circuits,
   wherein the at least one land pin has a hole,
   wherein the hole has a first width,
   wherein the at least one post pin includes:
      a bottom surface; and
      a base portion;
   wherein the bottom surface has a second width,
   wherein the base portion has a third width,
   wherein the second width is less than the first width, and
   wherein the third width is greater than the first width.

2. The module of claim 1, wherein the integrated circuit package includes:
   a board having an integrated circuit chip.

3. The module of claim 1, wherein the printed circuit board includes:
   a plurality of land pins provided on the first surface of the printed circuit board; and
   a plurality of post pins fixed on the second surface of the printed circuit board.

4. The module of claim 3, wherein a number of the land pins is equal to a number of the post pins.

5. The module of claim 1, wherein the hole of the at least one land pin includes:
   a main hole, and
   a sub hole connected to the main hole.

6. The module of claim 1, wherein the at least one post pin has at least one groove provided on a side surface of the at least one post pin in a longitudinal direction.

7. The module of claim 1, wherein the first surface is on an opposite side of the printed circuit board from the second surface.

8. The module of claim 1, wherein the at least one post pin has a circular cross-sectional shape.

9. The module of claim 1, wherein the at least one post pin has a circular cross-sectional shape having at least one furrow provided on a side surface of the at least one post pin.

10. The module of claim 1, wherein the at least one post pin is a single structure.

11. The module of claim 1, wherein the hole of the at least one land pin is circular.

12. A package, comprising:
   a board supporting an integrated circuit chip;
   at least one post pin fixed on a surface of the board; and
   at least one land pin provided on another surface of the board;
   wherein the at least one post pin is electrically connected to the integrated circuit chip,
   wherein the at least one land pin is electrically connected to the integrated circuit chip,
   wherein the at least one land pin has a hole,
   wherein the hole has a first width,
   wherein the at least one post pin includes:
      a bottom surface; and
      a base portion;
   wherein the bottom surface has a second width,
   wherein the base portion has a third width,
   wherein the second width is less than the first width, and
   wherein the third width is greater than the first width.

13. The package of claim 12, wherein the hole of the at least one land pin includes:
   a main hole and
   a sub hole connected to the main hole.

14. The package of claim 12, wherein the at least one post pin has a circular cross-sectional shape.

15. The package of claim 12, wherein the hole of the at least one land pin is circular.

16. The package of claim 12, wherein the at least one post pin has a circular cross-sectional shape having at least one furrow provided on a side surface of the at least one post pin.

17. The package of claim 12, wherein the surface of the board is on an opposite side of the board from the another surface of the board.

18. The package of claim 12, wherein the at least one post pin is a single structure.

19. The package of claim 12, further comprising:
   a plurality of post pins fixed on the surface of the board; and
   a plurality of land pins provided on the another surface of the board.

20. The package of claim 19, wherein a number of the post pins is equal to a number of the land pins.

* * * * *